United States Patent [19]
Kok et al.

[11] Patent Number: 6,113,749
[45] Date of Patent: *Sep. 5, 2000

[54] SPUTTERING METHOD IN MULTI-CHAMBERED DEVICE

[75] Inventors: Ronaldus J.C.M. Kok, Eindhoven; Jeroen F.M. Landsbergen, Best; Jan Visser, Weert, all of Netherlands

[73] Assignee: Odme International B.V., Veldhoven, Netherlands

[*] Notice: This patent issued on a continued prosecution application filed under 37 CFR 1.53(d), and is subject to the twenty year patent term provisions of 35 U.S.C. 154(a)(2).

[21] Appl. No.: 08/631,212

[22] Filed: Apr. 12, 1996

[30] Foreign Application Priority Data

Apr. 13, 1995 [NL] Netherlands ............ 1000138

[51] Int. Cl.$^7$ .................................. C23C 14/34
[52] U.S. Cl. .................. 204/192.12; 204/298.07; 204/298.25; 204/298.27; 204/298.28
[58] Field of Search .................. 204/192.1, 192.12, 204/298.07, 298.25, 298.26, 298.27, 298.28, 298.29; 118/719

[56] References Cited

U.S. PATENT DOCUMENTS

| | | | |
|---|---|---|---|
| 3,915,117 | 10/1975 | Schertler | 204/298.25 |
| 4,125,446 | 11/1978 | Hartsough et al. | 204/192.15 |
| 4,420,385 | 12/1983 | Hartsough | 204/192.23 |
| 4,675,096 | 6/1987 | Tateishi et al. | 204/298.25 |
| 4,886,592 | 12/1989 | Anderle et al. | 204/298.25 |
| 4,943,363 | 7/1990 | Zejda et al. | 204/298.25 |
| 5,205,918 | 4/1993 | Kinokiri et al. | 204/298.25 |
| 5,245,736 | 9/1993 | Schertler | 29/33 P |

FOREIGN PATENT DOCUMENTS

| | | |
|---|---|---|
| 0 136 562 | 4/1985 | European Pat. Off. . |
| 0 312 694 | 4/1989 | European Pat. Off. . |
| 0463392 A1 | 1/1992 | European Pat. Off. . |

OTHER PUBLICATIONS

European Patent Office Search Report, Aug. 14, 1996.
Database WPI, Section Ch, Week 8920, Derwent Publications Ltd., Lindon, GB; Class L03, AN 89–1483831 & JP–A–01 092 367 Apr. 11, 1989.
Database WPI, Section Ch, Week 9224, Derwent Publications Ltd., London, GB; Class L03, AN 92–197679, Anonymous; "Differential pumping of gas mixt. having different conductances, etc.–by supplying to vacuum chamber under viscous flow conditions so differing speeds affect partial pressure ratio" & Research Disclosure, vol. 337, No. 0889, May 10, 1992, Emsworth, GB.
Derwent, JP1092367 —Abstract.
Derwent, RD–337089 —Abstract.

*Primary Examiner*—Rodney McDonald
*Attorney, Agent, or Firm*—Pillsbury Madison & Sutro Intellectual Property Group, LLP

[57] ABSTRACT

A substrate is processed in a device having a vacuum chamber, at least one sputtering chamber, and a flow channel connecting the vacuum chamber to the sputtering chamber. According to the method, material is sputtered onto the substrate located in the sputtering chamber so that a sputtering gas flux amount is consumed by deposition onto the substrate. Prior to and during sputtering, sputtering gas flux flows into the vacuum chamber so that the total amount of sputtering gas flux flowed into the vacuum chamber prior to sputtering is substantially equal to the sputtering gas flux amount. At least during sputtering, the vacuum chamber is maintained at a partial pressure in a range of from more than $1 \times 10^{-5}$ mbar up to $5 \times 10^{-3}$ mbar.

8 Claims, 6 Drawing Sheets

SPUTTERING METHOD IN MULTI-CHAMBERED DEVICE

BACKGROUND OF THE INVENTION

1. Field of the Invention

The invention relates to a device for processing a substrate, the device comprising a vacuum chamber and at least one sputtering chamber, which is connected to the vacuum chamber by means of a flow channel.

The invention also relates to a device for processing a substrate comprising a vacuum chamber, at least one sluice chamber and at least one sputtering chamber, whereby the device is provided with a substrate carrier which is movable within the vacuum chamber, the substrate carrier comprising a carrying table which is rotatable in one plane, by means of which a substrate to be processed can be moved from the sluice chamber to the sputtering chamber and vice versa.

The invention furthermore relates to a device for processing a substrate, the device comprising a vacuum chamber, at least one sluice chamber and at least one sputtering chamber, whereby the device is provided with a substrate carrier which is movable within the vacuum chamber, the substrate carrier comprising a carrying table which is rotatable in one plane and which is movable transversely to the plane, by means of which a substrate to be processed can be moved from the sluice chamber to the sputtering chamber and vice versa.

2. Description of the Related Art

Devices of the kind referred to in the introduction are known from European Patent EP-B1-0 136 562.

A substrate to be processed is introduced into the sputtering chamber via the vacuum chamber and coated with a relatively thin film of material, for example aluminum, by means of a sputtering deposition process. The properties of the sputtered film are partly determined by reactive residual gases present in the vacuum in the sputtering chamber. A frequently occurring residual gas is water, which in many cases reacts with the material of the film. If the material is aluminum, aluminum oxide is thereby formed in the film, which is in most cases undesirable. Aluminum oxide for example has a negative influence on the reflective properties of the aluminum film.

In order to minimize the influence of the residual gas, the ratio of a flow of particles of the desired material and of a flow of particles of the residual gas to the substrate needs to be sufficiently large. When a substrate is introduced into the vacuum chamber, air containing reactive gases such as $O_2$ and $H_2O$ finds its way into the vacuum chamber and when the substrate is moved from the vacuum chamber to the sputtering chamber, part of the air containing the reactive residual gases finds its way into the sputtering chamber. It has been attempted to extract the air from the vacuum chamber by means of a pump system. The sputtering chamber is in open communication with the vacuum chamber via the flow channel. The residual gases present in the sputtering chamber are led to the vacuum chamber and largely removed therefrom by means of the vacuum chamber. As the frequency at which the substrates are introduced into and removed from the vacuum chamber and the sputtering chamber increases, however, the average amount of air being supplied via the sluice chamber per time unit will also increase. This also leads to higher demands on the pump system. The amount of residual gas molecules in the film cannot be limited to the amount of residual gas molecules present in the sputtering chamber, since the sputtering chamber is in open communication with the vacuum chamber via the flow channel. The incorporation of residual gas molecules in the film to be sputtered immediately leads to a difference in the partial pressures of the residual gas in the vacuum chamber and the residual gas in the sputtering chamber, as a result of which the residual gas in the sputtering chamber is replenished by residual gas molecules from the vacuum chamber. As a result of this a large number of residual gas molecules find their way into the film, even if the volume of the sputtering chamber is relatively small.

A solution would seem to be to close the sputtering chamber during the deposition of the film. However, a so-called sputtering gas (mostly argon) is required for maintaining the gas discharge of the sputtering process, which sputtering gas must have a particular partial pressure. Atoms of the sputtering gas are enclosed in the growing film, as a result of which the sputtering gas partial pressure falls below an allowed value. In view of the relatively great and quick pressure changes it is not possible to regulate a desired sputtering gas partial pressure in a closed sputtering chamber.

With the device according to European patent EP-B1-0 136 562 a sputtering gas, argon, is used, which flows to the vacuum chamber via the sputtering chamber and via the flow channel. In such a known system the sputtering gas flux being supplied is much greater than the amount of sputtering gas flux incorporated in the film. A relatively large sputtering gas flux with a given sputtering pressure means that the effective pump rate of the pump system must be relatively great, which makes the device relatively costly.

SUMMARY OF THE INVENTION

The object of the invention is to provide a device whereby the amount of contamination of the film to be applied by residual gases is limited, whereby the sputtering gas flux being supplied is relatively low and whereby substrates can be exchanged relatively quickly at a relatively low pump rate.

This objective is accomplished with a device according to the invention in that the gas conductance of the flow channel is such that in operation, before the sputtering process is started, there is a sputtering gas flux from the sputtering chamber to the vacuum chamber which is substantially equal to a sputtering gas flux consumed in the sputtering chamber during said sputtering. Additionally, in a preferred embodiment the sputtering gas flux at which the sputtering gas flows from the sputtering chamber to the vacuum chamber, both prior to and during sputtering, is substantially equal to a flux at which the sputtering gas is consumed in the sputtering chamber during sputtering.

The gas conductance of a channel may be calculated physically or may be determined by experiment and is expressed in liters per second. By selecting the gas conductance of the flow channel such that, given a particular partial pressure of the sputtering gas, the sputtering gas flux to the vacuum chamber is substantially equal to the sputtering gas flux incorporated by the film during the sputtering process, it will be possible to use the smallest possible opening between the sputtering chamber and the vacuum chamber that is required in order to achieve a controllable process, and the required amount of sputtering gas to be supplied to the sputtering chamber is considerably reduced. As a result, the throughput of the flow channel for the residual gases will be minimized. The flux of residual gas molecules from the vacuum chamber to the sputtering chamber is directly proportional to the difference in the partial pressures and the gas conductance of the flow channel.

In practice it has become apparent that it is possible with the device according to the invention to apply a film of material at a residual gas pressure in the vacuum chamber which may be two orders of magnitude greater than is the case with the known device. After sputtering has started as a result of a discharge, the sputtering gas pressure will fall as a result of the consumption of the sputtering gas by the film of material, but it will remain within a predetermined value as a result of the supply of sputtering gas to the sputtering chamber. An additional advantage of the device according to the invention is that it is possible to use a relatively high sputtering gas pressure at the beginning of the sputtering process, which makes it simpler to ignite the discharge, whilst the discharge is spread over the material to be sputtered as a result of the subsequent controlled reduction of the sputtering gas pressure, which leads to a more uniform utilization of the material.

Another device according to the invention is a device for processing a substrate comprising a vacuum chamber, at least one sluice chamber and at least one sputtering chamber, whereby the device is provided with a substrate carrier which is movable within the vacuum chamber, the substrate carrier comprising a carrying table which is rotatable in one plane, by means of which a substrate to be processed can be moved from the sluice chamber to the sputtering chamber and vice versa, which is characterized in that the carrying table comprises substrate holders which are individually movable transversely to the plane.

As a result of this a substrate can be introduced into and be removed from the sputtering chamber at a point of time which is independent of the introduction or removal of another substrate into or from the sluice chamber, although this may also take place simultaneously.

Another device according to the invention is a device for processing a substrate comprising a vacuum chamber, at least one sluice chamber and at least one sputtering chamber, whereby the device is provided with a substrate carrier which is movable within the vacuum chamber, the substrate carrier comprising a carrying table which is rotatable in one plane, by means of which a substrate to be processed can be moved from the sluice chamber to the sputtering chamber and vice versa, which is characterized in that the carrying table is provided with a shaft extending transversely to the plane, said shaft being provided with slots extending transversely to the plane, in which slots balls journalled in a ball bush are positioned, whereby the shaft is capable of rotation together with the ball bush and whereby the shaft is capable of translating movement with respect to said ball bush.

Thus it is possible to translate and rotate the carrying table in a relatively simple, inexpensive and quick manner.

BRIEF DESCRIPTION OF THE DRAWINGS

The invention will be explained in more detail below with reference to the drawing, in which:

FIGS. 6A and 6B each show a carrying table of a device according to the invention, whereby FIG. 6A shows the device in plan view and FIG. 6B shows the device partly in side view and partly in sectional view.

Like parts are numbered alike in the Figures.

DESCRIPTION OF THE PREFERRED EMBODIMENTS

Figure 1:
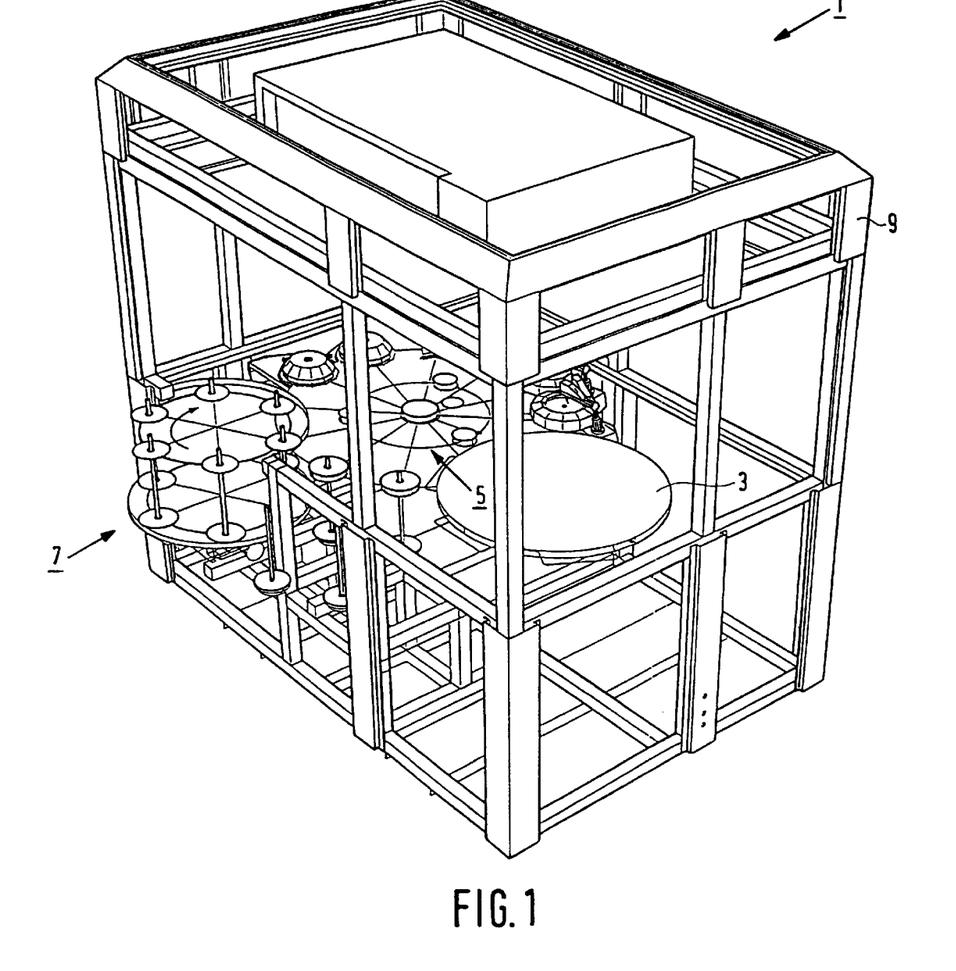
FIG. 1 is a diagrammatic perspective view of an apparatus provided with a device according to the invention.
Figure 2:
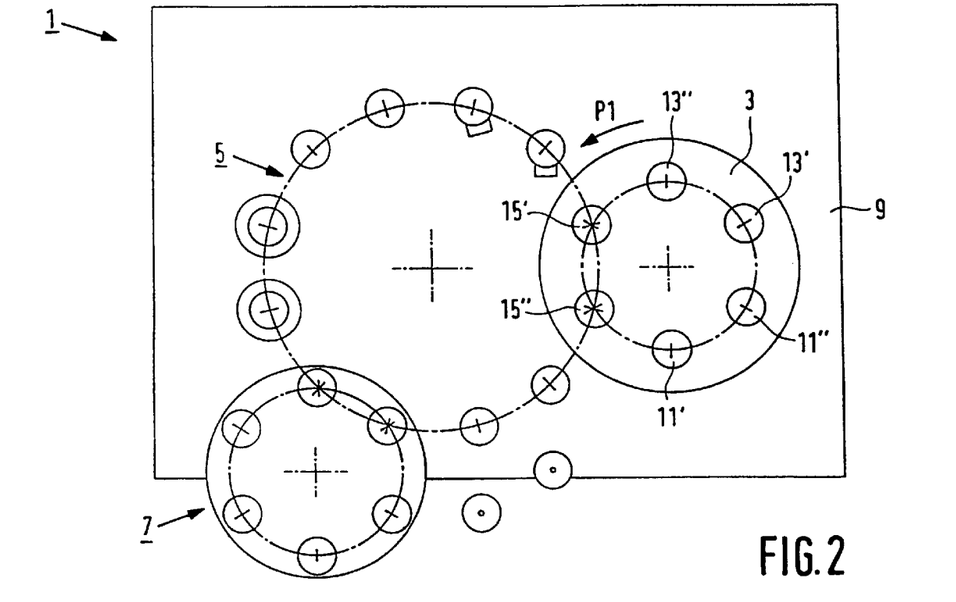
FIG. 2 is a diagrammatic plan view of the apparatus shown in FIG. 1.

FIGS. 1 and 2 show an apparatus 1 which is provided with a device 3 according to the invention. The apparatus 1 furthermore comprises a device 5 which is described in detail in the applicant's European Patent Application EP-A1-0 574 975 with reference to FIG. 1 of said application. Therefore the device 5 will not be explained in more detail herein. The apparatus 1 furthermore comprises a collecting device 7, which is known per se and does not form part of the device according to the invention.

The devices 3, 5 and 7 are accommodated within a frame 9. Referring to FIG. 2, device 3 comprises two inlet sluice stations 11', 11", two processing stations 13', 13" and two outlet stations 15', 15". At the inlet stations 11', 11" substrates, for example injection-moulded plastic CD-discs which are to be coated with a metal film, such as for example aluminum, are introduced into the device 3. Then the substrates are moved to the processing stations 13', 13" by means of a substrate carrier 17 (FIG. 3), which is rotatable in the direction indicated by arrow P1, at which processing stations the metal film is applied. Then the substrates are taken to the outlet stations 15', 15" by means of substrate carrier 17. The outlet stations 15', 15" form the inlet positions for the device 5. Substrates are passed through apparatus 1 in pairs, whereby the respective first substrates are subjected to a processing or treatment step at the stations indicated by 13' and the respective second substrates are subjected to a processing or treatment step at the stations indicated by 13". This leads to a more effective use of the vacuum chamber and a relatively high output of the device. Because separate inlet stations 11', 11" and outlet stations 15', 15" are used, it is possible to introduce a substrate into the device while at the same time another substrate is transported out of the device. This results in a shorter cycle period than with a device wherein only a combined inlet and outlet station is available, by which a substrate must be transported into and out of the vacuum chamber.

Figure 3:
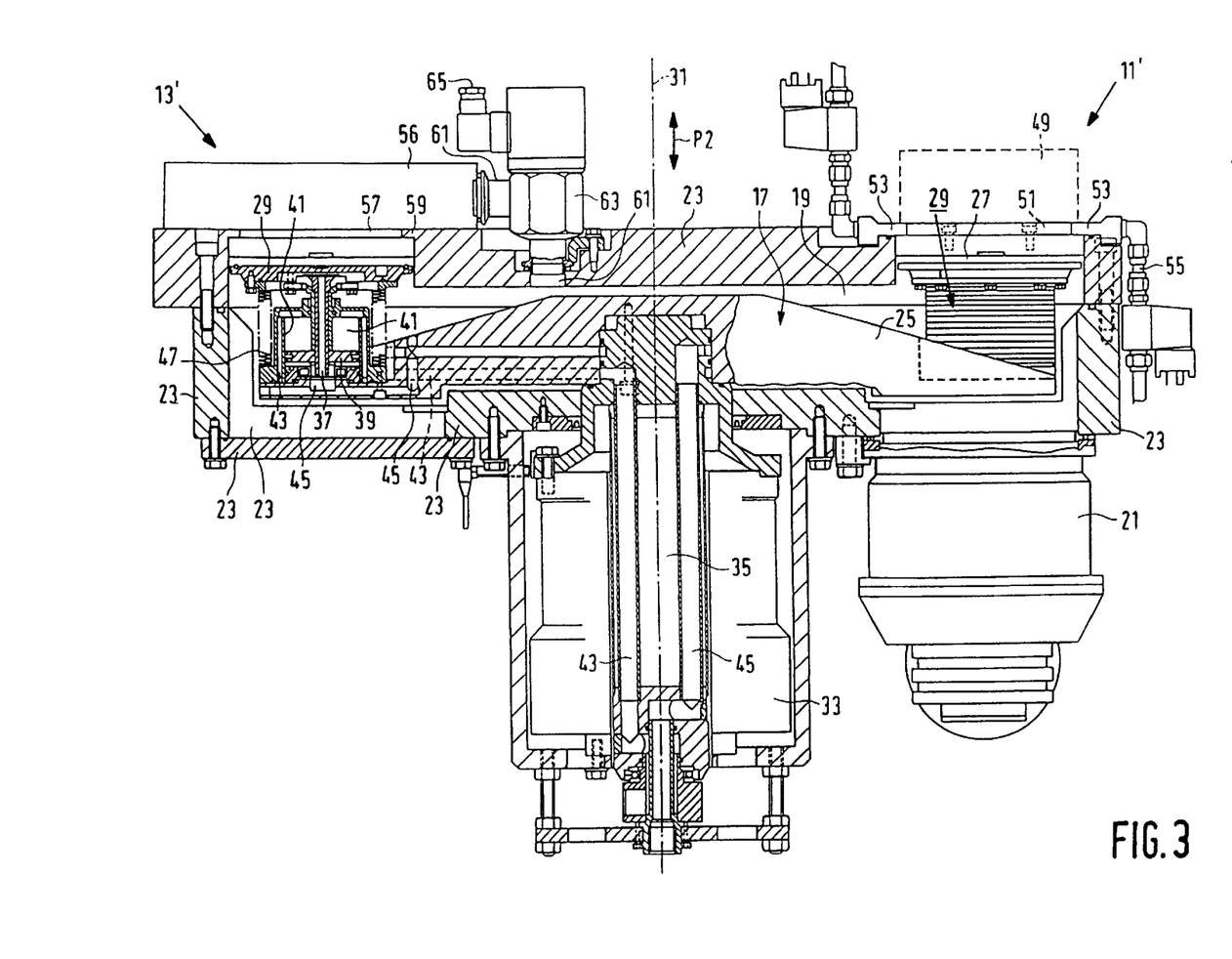
FIG. 3 is a cross-sectional view of the device shown in FIG. 1.

FIG. 3 is a sectional view of the device 3 shown in FIG. 1, wherein two stations are shown. The left-hand station is the processing station 13' and the right-hand station is the inlet station 11'. The other inlet and outlet stations 11", 15' and 15" are identical to inlet station 11'. Processing station 13" is identical to processing station 13'.

The device 3 comprises the cylindrical vacuum chamber 19, which is bounded by walls 23. A high vacuum is obtained in vacuum chamber 19 by means of a turbomolecular pump 21. A substrate carrier 17 is positioned within vacuum chamber 19 so as to be rotatable therein. Said substrate carrier 17 comprises a circular carrying table 25, which is on its outer edge provided with six substrate holders 27. Each substrate holder 27 is movable in a direction indicated by arrow P2 by means of a cylinder-piston assembly 29, which will be explained in more detail below. The carrying table 25 is rotatable about a common central axis 31 of the vacuum chamber 19 and the carrying table 25 by means of a motor 33 (only diagrammatically indicated), which drives a shaft 35 extending transversely to the carrying table 25 and being connected to the carrying table. The cylinder-piston assembly 29 comprises a shaft 37 connected to substrate holder 27, which shaft extends parallel to the central axis 31. At one end remote from substrate holder 27 shaft 37 is provided with a piston 39, which is movably journalled in a cylinder 41. Compressed air may be injected into the cylinder 41 in an alternating manner, via channels 43 and 45 respectively, against a side of the piston facing the substrate holder 27 and against a side facing away from the substrate holder 27. An atmospheric pressure will prevail in the channel during the time that the channel is not connected to compressed air.

In this way the piston 39 and the cylinder 41 can be moved up and down. The cylinder 41 is enveloped by a bellows 47, which forms an airtight partition between the vacuum chamber 17 and the cylinder 41, so that in case from a leakage of cylinder 41 the vacuum which prevails within chamber 19 is not disturbed and the turbomolecular pump 21 is not damaged.

The inlet station 11' is provided with a cover 49 (illustrated in dotted lines), which is removably provided on passage 51. The cover is provided with an O-ring. A space bounded by cover 49 and a substrate holder 27 moved against an edge 53 of passage 51 forms the inlet chamber, in which a partial vacuum may be generated via a pipe 55. When a substrate is to be introduced, the substrate holder 27 is first pressed against the edge 53. Then cover 49 is opened, after which a substrate is placed on substrate holder 27. Then the air present in the inlet chamber is removed as much as possible from the inlet chamber bounded by cover 49 and substrate holder 27 via pipe 55. Subsequently the substrate holder 27 is moved away from edge 53, as a result of which the substrate and the remaining gases enter the inlet chamber in the vacuum chamber 19. Then the residual gases are removed as much as possible by means of the turbomolecular pump 21. When the substrate is to be removed from the vacuum chamber 19, the substrate holder 27 is first placed against the edge 53 before the cover 49 is opened. A space bounded by the substrate holder 27 and said edge thereby forms the outlet chamber. After a substrate has been introduced into the vacuum chamber 19, the substrate is transported to a processing station 13', 13" by means of the carrying table 25. The processing station 13' is provided with a sputtering unit 56 (illustrated in dotted lines). At the processing station 13' the substrate holder and the substrate present thereon are moved upwards until the substrate holder 27 is pressed against an edge 59 bounding an opening 57, after which a film of material can be sputtered on the substrate. A space bounded by the sputtering unit 56 and the substrate holder 27 pressed against the edge 59 forms the sputtering chamber 60 (see FIG. 4), which is in open communication with the vacuum chamber 19 via a pipe 61. The pipe 61 can be closed by means of a valve 63 when the sputtering unit 56 must be removed in connection with maintenance work. The substrate holder 27 is thereby placed against the edge 59 in order to be able to remove the sputtering unit. After the maintenance work has been completed, a vacuum is generated in the sputtering chamber 60 again via a pipe 65.

Figure 4:
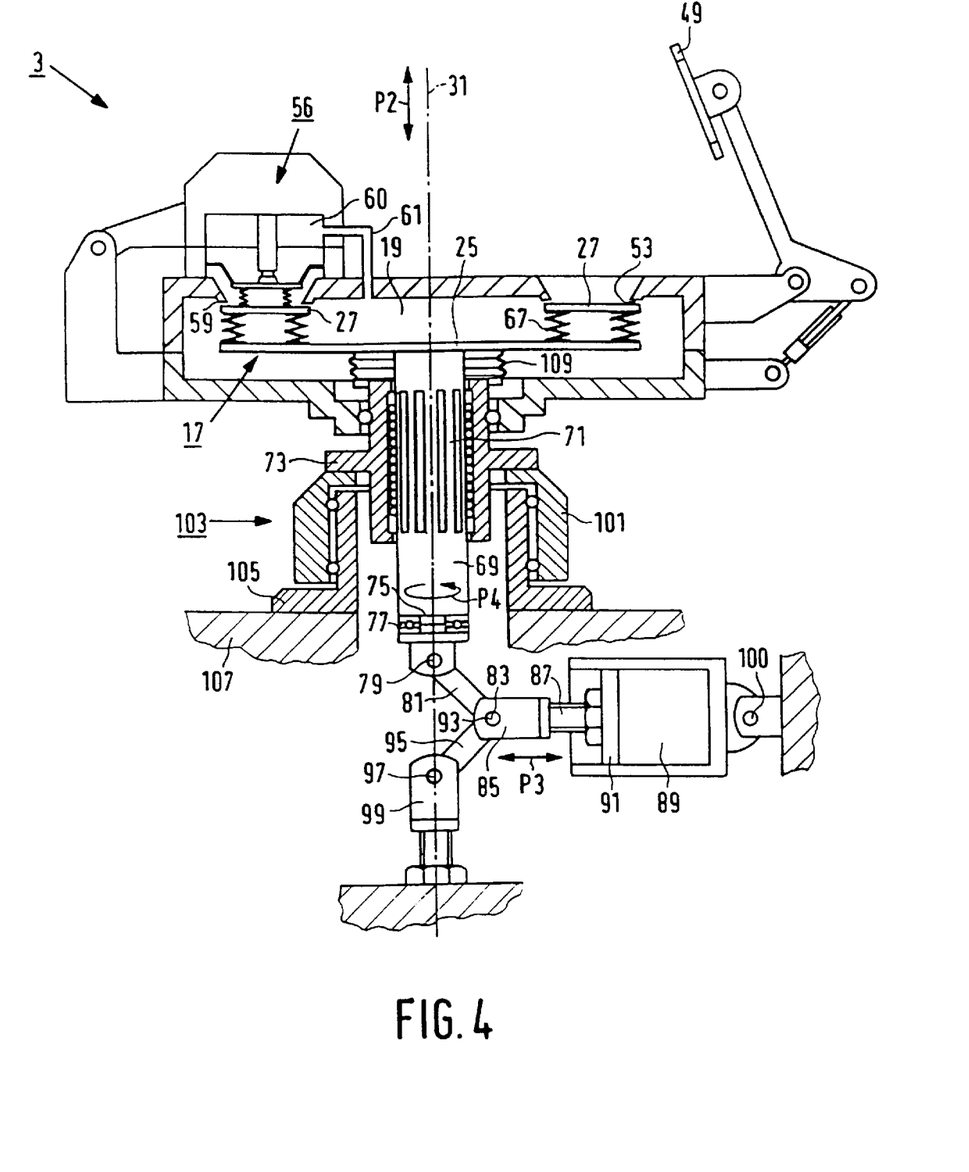
FIG. 4 is a diagrammatic cross-sectional view of another device according to the invention.
Figure 5:
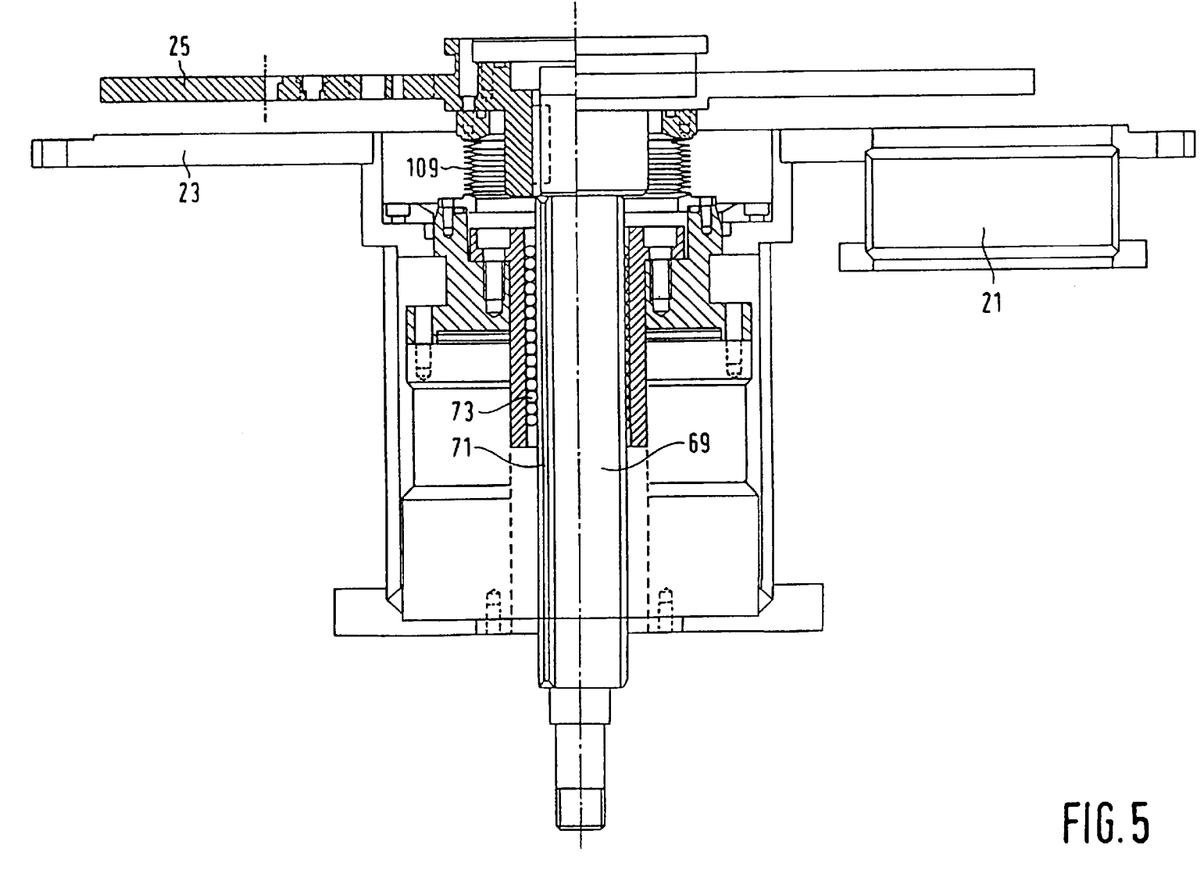
FIG. 5 shows in detail a part of the device shown in FIG. 4.

FIGS. 4 and 5 show another embodiment of a device 3 according to the invention.

The substrate carrier 17 is provided with a carrying table 25, which comprises a substrate holder 27 supported by springs 67. The springs 67 make it possible to adjust the tilt at which the substrate holders 27 are placed against the edges 53, 59.

The carrying table 25 is provided with a shaft 69 extending perpendicularly to the carrying table 25, said shaft comprising a plurality of slots 71 extending in the direction of the central axis 31. Shaft 69 is journalled in a ball bush 73, which comprises a plurality of ball tracks, which are provided in a number which corresponds with the number of slots 71. One end 75 of the shaft 69 remote from the carrying table 25 is supported by an axial bearing 77, which is pivoted to one end 79 of an arm 81. The arm 81 is pivoted to a block 85 with its other end 83, which block is secured, via a bolt 87, to a piston 91 which is movable within a cylinder 89 in the direction of arrow P3. The direction indicated by arrow P3 is transverse to the direction indicated by arrow P2. One end 93 of a second arm 95 is secured to block 85, which arm is with its other end 97 pivoted connected to a vertically adjustable support 99. Shaft 69 is moved in the direction indicated by arrow P2 by moving the piston 91 within cylinder 89. The cylinder 89 is thereby tilted about its pivot point 100. The lowermost and uppermost positions of the carrying table 25 can be adjusted by means of the bolt 87 and the vertically adjustable support 99. During the movement of the shaft 69 in the direction indicated by arrow P2 the balls in the ball bush 73 roll through the slots 71. The ball bush 73 is connected to a rotor 101 of a motor 103. Stator 105 of motor 103 is secured to a support 107. When the motor 103 is electrically energized, the rotor 101 will rotate about stator 105 in a direction indicated by arrow P4, whereby the balls of ball bush 73 will engage the walls of the slot 71 and take shaft 69 along with the rotation of the rotor 101. The ball bush 73 is at one end provided with a bellows 109, which is also connected to carrying table 25. The bellows 109 forms a seal for the vacuum chamber 19.

Figure 6A:
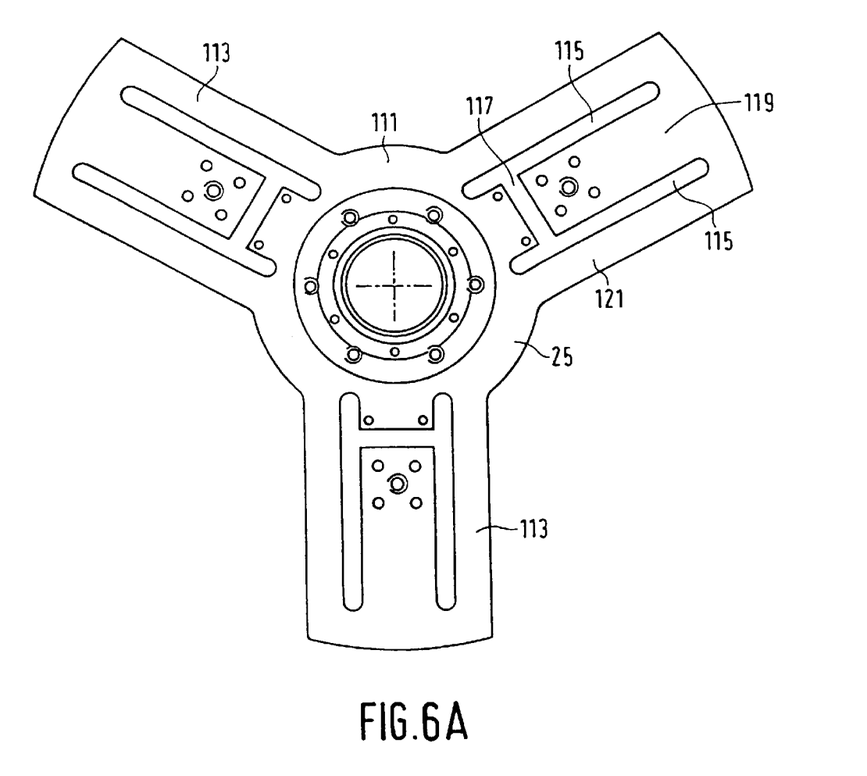
Figure 6B:
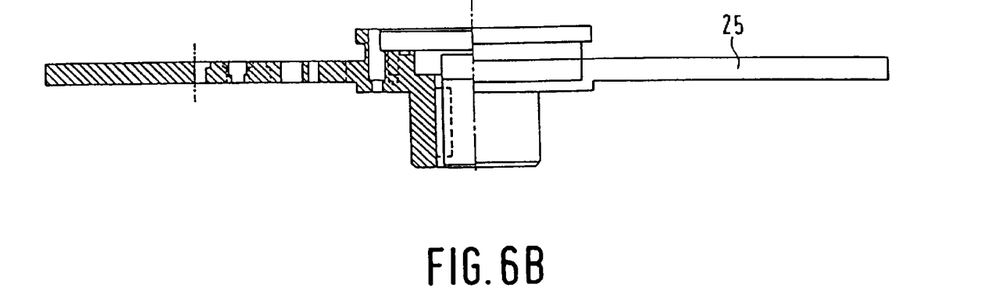

FIGS. 6A and 6B show a carrying table 25 of another device according to the invention, which has only one inlet station, one processing station and one outlet station. The carrying table 25 comprises a central part 111, from which three carrying arms 113 extend. Each carrying arm 113 is provided with two parallel slots 115, which are interconnected by a slot 117. The slots 115, 117 form hinge elements, which enable a part 119 of the carrying arm 113 positioned between the slots 115 to pivot with respect to the other part 121 of the carrying arm 113. In this manner no separate springs 67 as shown in FIG. 4 are required. The spaces between carrying arms 113 facilitate the flux of molecules present above the carrying table to the turbomolecular pump disposed below carrying table 25.

Now the function of pipe or flow channel 61 will be explained in more detail with reference to FIG. 3, proceeding from the situation wherein the substrate holder 27 is positioned against edge 59 and a substrate to be provided with a film of material is present on substrate holder 27. The rate at which an aluminum film is applied to a compact disc substrate is for example 300 Å per second.

The water partial pressure at which the number of water molecules which reaches the substrate is the same as the number of sputtered aluminum atoms is about $2.5 \times 10^{-4}$ mbar. It has been established that in order to obtain a relatively satisfactory film the water partial pressure in the sputtering chamber must not exceed a value of a few times $10^{-5}$ mbar. With a compact disc substrate on which aluminum films having a thickness of $\approx 600$ Å are applied over a surface area of 300 cm$^2$, the proportion of the number of aluminum atoms in relation to the number of water molecules in the gas phase at a water partial pressure of $10^{-5}$ mbar in a sputtering chamber having a capacity of 1 liter is about $2 \times 10^5$. If the number of water molecules remains limited to this value, the negative influence of the water molecules on the quality of the film will be negligible. Water molecules may migrate from the vacuum chamber 19 to the sputtering chamber via pipe 61, however. As already indicated before, it is not possible to shut off the pipe 61 during the sputtering process, because a growing aluminum film being sputtered will enclose part of the sputtering gas, argon, that is required for the sputtering process. The required argon sputtering pressure is about 5 to $8\times10^{-3}$ mbar. It is known that when the deposition rates are high during sputtering, the number of argon atoms enclosed in the film may be about 5–10% of the number of sputtered atoms. If a film of about 600 Å is applied to a surface area of about 300 cm$^2$ in approximately 2 seconds, this may be translated into an aluminum flux of about $2.3\times10^{19}$ aluminum atoms per second. The flux of argon atoms which disappears into the film will thus be about $1.1–2.3\times10^{18}$ argon atoms per second. A flux of $2.3\times10^{18}$ argon atoms per second corresponds with an argon gas flux of about 0.09 mbar×liters per second (=5.4 sccm). This gas flux will have to be supplied in order to maintain the argon pressure needed for the discharge which is required for the sputtering process. In principle the argon gas flux might be led into a closed sputtering chamber. In practice this is not feasible, however, because the pressure changes may be so great and take place so quickly that it is impossible to make the necessary corrections during the short sputtering period by allowing the gas to flow in. Consequently the required sputtering gas is introduced into sputtering chamber 56 and partly flows into vacuum chamber 19, via pipe 61, before sputtering is started, from where the gas is discharged by the turbomolecular pump 21. With the device 3 according to the invention the gas conductance of the pipe 61 between the vacuum chamber 19 and the sputtering chamber is such that in the case of a continuous argon gas flux in the sputtering chamber 56 which is equal to the argon gas flux of 0.09 mbar 1/sec being consumed by the film during sputtering, a desired argon sputtering gas pressure of for example $8\times10^{-3}$ is generated in the sputtering chamber before sputtering is started. The gas conductance of pipe 61 thus must be about 0.09: $8\times10^{-3}$, which is 11 liters per second, for argon. The gas conductance is inversely proportional to the square root of the molecular mass. Argon has a molecular mass 40 and water has a molecular mass 18, so that the pipe 61 for water has a gas conductance of $$11 \cdot \sqrt{\frac{40}{18}} = 16$$

liters per second. The amount of water which flows from the vacuum chamber through pipe 61 into the sputtering chamber is equal to the gas conductance of pipe 61 for water times the difference in the water partial pressure between the vacuum chamber and the sputtering chamber. The amount of water is therefore equal to $16\times\Delta P$ 1/sec, whereby $\Delta P$ is the partial pressure difference. The amount of water molecules per mbar liter is $2.5\times10^{19}$. It has been indicated before that for an open communication in a known device, given a water partial pressure of $2.5\times10^{-4}$ mbar, the flux of water molecules and the flux of aluminum molecules will be equal. If this is the water partial pressure $\Delta P$, then the flux of water molecules equals $16\times2.5\times10^{-4}\times2.5\times10^{19}$ water molecules per second, which is about $10^{17}$ water molecules per second. The flux of aluminum atoms is about $2.3\times10^{19}$ aluminum atoms per second, so that the flux of water molecules is about 0.5% of the number of aluminum atoms. It has been indicated before that with a known device the water partial pressure within the vacuum chamber must not exceed a value of a few times $10^{-5}$ mbar in order to obtain a satisfactory quality of the sputtered film, or, a flux of water molecules of less than about 10% of the flux of aluminum atoms. With a device according to the invention the flux of water molecules is 20 times smaller than the flux of water molecules with the known device, which makes the device according to the invention considerably better than the known device, therefore. Only in the case of a water partial pressure difference $\Delta P$ of $20\times2.5\times10^{-4}=5\times10^{-3}$ mbar will the flux of water molecules in the sputtering chamber of the device according to the invention be equal to the flux of water molecules of the known device. With the device according to the invention the maximum allowable water partial pressure may thus be considerably higher than with a device known from the prior art, whilst achieving the same film quality. With the device according to the invention a satisfactory quality of the applied film is obtained when substrates are introduced into and removed from the vacuum chamber quickly, in spite of the relatively high residual gas partial pressures in the vacuum chamber. The gas conductance values for a different sputtering pressure, a different sputtering gas and a different amount of consumed sputtering gas flux may be determined in a comparable manner.

A round tube having a diameter D and a length L is taken as an example of a flow channel. In the case of a molecular flux the gas conductance C of the tube is $$C = 3.8 \frac{D^3}{L} \times \left(\frac{T}{M}\right)^{\frac{1}{2}}$$

wherein
 T=temperature of the gas (K)
 D=diameter of the tube (cm)
 L=length of the tube (cm)
 M=molecular mass (gramme)
 C=gas conductance (1/sec)
With a desired gas conductance of C-11 1/sec for argon (M-40) at 300 K, it follows that $$\frac{D^3}{L} = 1.06.$$

A tube to be used has a diameter d of 2 cm and a length of 7.5 cm, for example.

What is claimed is:

1. A method of processing a substrate in a device comprising a vacuum chamber, at least one sputtering chamber having a gas inlet, and a flow channel connecting the vacuum chamber to the sputtering chamber, said method comprising:

flowing a sputtering gas through the inlet and into the sputtering chamber and positioning the flow channel connecting the sputtering chamber to the vacuum chamber in an open state to establish a first sputtering gas flux at which the sputtering gas flows through the flow channel and into the vacuum chamber; and subsequent to establishing the first sputtering gas flux, sputtering the sputtering gas onto the substrate located in the sputtering chamber so that the sputtering gas is consumed by deposition onto the substrate at a second sputtering gas flux while maintaining the flow channel in the open state;

wherein the first sputtering gas flux at which the sputtering gas flows through the flow channel and into the vacuum chamber prior to said sputtering is substantially equal to the second sputtering gas flux at which the sputtering gas is consumed by deposition onto the substrate during said sputtering.

2. A method according to claim 1, wherein a flux at which the sputtering gas is flowed into the sputtering chamber, both prior to and during said sputtering, is substantially equal to the second sputtering gas flux.

3. A method according to claim 1, further comprising maintaining, at least during said sputtering, a water partial pressure difference between the sputtering chamber and the vacuum chamber in a range of from more than about $1 \times 10^{-5}$ mbar up to about $5 \times 10^{-3}$ mbar.

4. A method of processing a substrate in a device comprising a vacuum chamber, at least one sluice chamber, at least one sputtering chamber having a gas inlet, a flow channel connecting the vacuum chamber to the sputtering chamber having an opening, and a substrate carrier comprising a table carrying substrate holders, said table being rotatable in a plane to move said substrate holders between the sluice chamber and the sputtering chamber, said substrate holders being movable transversely to the plane, said method comprising:

placing the substrate on the table and rotating the table to move the substrate from the sluice chamber to the sputtering chamber;

moving one of the substrate holders transversely to the plane to close the opening of the sputtering chamber;

flowing a sputtering gas through the inlet and into the sputtering chamber to establish a first sputtering gas flux at which the sputtering gas is flowed into the vacuum chamber and positioning the flow channel connecting the sputtering chamber to the vacuum chamber in an open state to permit the sputtering gas to flow through the flow channel and into the vacuum chamber; and subsequent to establishing the sputtering gas flux, sputtering the sputtering gas onto the substrate located in the sputtering chamber so that the sputtering gas is consumed by deposition onto the substrate at a second sputtering gas flux while maintaining the flow channel in the open state;

wherein the first sputtering gas flux at which the sputtering gas flows through the flow channel and into the vacuum chamber prior to said sputtering is substantially equal to the second sputtering gas flux at which the sputtering gas is consumed by deposition onto the substrate during said sputtering.

5. A method according to claim 4, wherein a flux at which the sputtering gas is flowed into the sputtering chamber, both prior to and during said sputtering, is substantially equal to the flux at the second sputtering gas flux.

6. A method according to claim 4, further comprising maintaining, at least during said sputtering, a water partial pressure difference between the sputtering chamber and the vacuum chamber in a range of from more than about $1 \times 10^{-5}$ mbar up to about $5 \times 10^{-3}$ mbar.

7. A method according to claim 4, wherein the sluice chamber is an inlet sluice chamber for introducing the substrate into the device, wherein the device further comprises an outlet sluice chamber for removing the substrate from the device.

8. A method according to claim 7, wherein the inlet sluice chamber and the outlet sluice chamber are a first inlet sluice chamber and a first outlet sluice chamber, respectively, and further wherein the device further comprises a second inlet sluice chamber and a second outlet sluice chamber.

* * * * *